United States Patent
Fukasawa et al.

(10) Patent No.: US 7,300,868 B2
(45) Date of Patent: Nov. 27, 2007

(54) DAMASCENE INTERCONNECTION HAVING POROUS LOW K LAYER WITH A HARD MASK REDUCED IN THICKNESS

(75) Inventors: Masanaga Fukasawa, Fishkill, NY (US); Takeshi Nogami, Chappaqua, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 84 days.

(21) Appl. No.: 11/394,011

(22) Filed: Mar. 30, 2006

(65) Prior Publication Data
US 2007/0231993 A1    Oct. 4, 2007

(51) Int. Cl.
*H01L 21/4763* (2006.01)
(52) U.S. Cl. .............. 438/639; 438/618; 438/637; 438/672; 257/E21.577
(58) Field of Classification Search .............. None
See application file for complete search history.

(56) References Cited

U.S. PATENT DOCUMENTS

| | | | |
|---|---|---|---|
| 6,468,898 B1* | 10/2002 | Usami | 438/638 |
| 6,566,258 B1 | 5/2003 | Dixit et al. | 438/687 |
| 6,806,192 B2 | 10/2004 | Lin et al. | 438/687 |
| 7,064,059 B2* | 6/2006 | Kim et al. | 438/637 |
| 2003/0064582 A1* | 4/2003 | Oladeji et al. | 438/638 |
| 2003/0124859 A1 | 7/2003 | Cheung et al. | 438/692 |
| 2003/0132510 A1 | 7/2003 | Barth et al. | 257/637 |
| 2004/0132291 A1 | 7/2004 | Lee et al. | 438/689 |
| 2004/0157453 A1 | 8/2004 | Delgadino et al. | 438/691 |
| 2004/0173908 A1 | 9/2004 | Barth et al. | 257/760 |
| 2004/0175581 A1 | 9/2004 | Nguyen et al. | 428/447 |
| 2004/0175922 A1 | 9/2004 | Solomentsev et al. | 438/622 |
| 2004/0180188 A1 | 9/2004 | Nakata et al. | 428/312.6 |
| 2004/0183202 A1 | 9/2004 | Usami | 257/762 |
| 2004/0195694 A1 | 10/2004 | Duncombe et al. | 257/759 |
| 2004/0198070 A1 | 10/2004 | Xia et al. | 438/786 |
| 2004/0201103 A1 | 10/2004 | Yau et al. | 257/758 |
| 2004/0203223 A1 | 10/2004 | Guo et al. | 438/637 |

(Continued)

OTHER PUBLICATIONS

Jerry Healey, "Current Technical Trends: Dual Damascene & Low-K Dielectrics", *Threshold Systems*, 2002.

(Continued)

*Primary Examiner*—Michael Lebentritt
*Assistant Examiner*—Cheung Lee
(74) *Attorney, Agent, or Firm*—Mayer & Williams P.C.; Stuart M. Mayer, Esq.; Karin L. Williams, Esq.

(57) ABSTRACT

A method is provided of fabricating a damascene interconnection. The method begins by forming on a substrate a first dielectric layer, a capping layer on the first dielectric sublayer and a resist pattern over the capping layer to define a first interconnect opening. The capping layer and the dielectric layer are etched through the resist pattern to form the first interconnect opening. The resist pattern is removed and a barrier layer is applied over the capping layer and in the first interconnect opening. An interconnection is formed by filling the first interconnect opening with conductive material. The interconnection is planarized to remove excess material and a portion of the first dielectric layer damaged by the planarizing step is selectively etched. A second dielectric layer is applied to replace the damaged portion of the first dielectric.

19 Claims, 6 Drawing Sheets

U.S. PATENT DOCUMENTS

| | | | |
|---|---|---|---|
| 2004/0209456 A1 | 10/2004 | Farrar | 438/627 |
| 2004/0214446 A1 | 10/2004 | Kim et al. | 438/706 |
| 2005/0017365 A1 | 1/2005 | Ramachandra Rao et al. | 257/758 |
| 2005/0095840 A1 | 5/2005 | Bhanap et al. | 438/623 |

OTHER PUBLICATIONS

P.C. Andricacos, et. al., "Damascene Copper Electroplating For Chip Interconnections", *I B M J. Res. Develop.*, Sep. 5, 1998, vol. 42, No. 5, pp. 567-574.

Stanley Wolf, Ph.D., "Introduction To Dual-Damascene Interconnect Processes", *Silicon Processing For the VLSI Era*, 2004, vol. 4, pp. 674-679.

P. Josh Wolf[1,4], PowerPoint presentation from International SeMaTech. "Overview of Dual Damascene Cu/Low-K Interconnect", Aug. 14, 2003, pp. 1-21.

Robert H. Havemann, et al., "High-Performance Interconnects: An Integration Overview", *Proceedings Of The IEEE*, May 5, 2001, vol. 89, No. 5, pp. 586-601.

Jiun-Yu Lai, et. al., "Evolution of Copper-Oxide Damascene Structures in Chemical Mechanical Polishing", *Journal of the Electrochemical Society*, 2002, vol. 149 (1), pp. G31-G40.

Ping Xu, et. al., "A Breakthrough in Low-k Barrier/Etch Stop Films for Copper Damascene Applications", *Semiconductor Fabtech*, 11th Edition, pp. 239-244, exact date unknown, but prior to the filing date of the instant application.

Sailesh M. Merchant, et. al., "Copper Interconnects for Semiconductor Devices", *Microelectronic Processing Overview*, Jun. 2001, 1 page.

Johnny Ho, et. al., "Tantalum Nitride Barrier Layer in Copper-Based ICs", 3 pages, exact date unknown, but prior to the filing date of the instant application.

"Evolution of Copper Oxide Damascene Structures In CMP: I. Contact Mechanics Modeling". Chapter 4, pp. 133-166, exact date unknown, but prior to the filing date of the instant application.

Michael E. Clarke, "Introducing Low-k Dielectrics Into Semiconductor Processing", *Application Notes*, 20 pages, www.mykrolis.com, exact date unknown, but prior to the filing date of the instant application.

Michel Lerme, "Multi Layer Metallization", 7 pages, exact date unknown, but prior to the filing date of the instant application.

"Back to the Future: Copper Comes of Age", http:domino.research.ibm.com/comm./wwwr_thinkresearch.nsf/pages/copper397.html Downloaded Nov. 15, 2004. 10 pages.

"Multilevel Wiring technology for Leading-Edge CMOS Devices in the 65 nm Generation", *Sony Global-CX-News*, vol. 33. 3 pages. http://www.sony.net/Products/SC-HO/cx_news/vol33/featuring.html Downloaded Nov. 15, 2004.

Connie P. Wang, et al., "Binary Cu-Alloy Layers for Cu-Interconnections Reliability Improvement", 2001, *IEEE*, pp. 86-88.

Y. Matsubara, et al., "Thermally Robust 90nm Node Cu-Al Wiring Technology Using Solid Phase Reaction Between Cu and Al", 2003, *Symposium on VLSI Technology Digest of Technical Papers*, pp. 127-128.

* cited by examiner

DAMASCENE INTERCONNECTION HAVING POROUS LOW K LAYER WITH A HARD MASK REDUCED IN THICKNESS

FIELD OF THE INVENTION

The present invention relates generally to single and dual damascene interconnections for integrated circuits, and more specifically to a single or dual damascene interconnection having a porous low k layer.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

Recently, porous low k materials have been employed in damascene processes. A void-filled, or porous dielectric material has a lower dielectric constant than the fully dense void-free version of the same material. Such porous low-dielectric constant materials may be deposited by chemical vapor deposition (CVD), or may be spun on in liquid solution and subsequently cured by heating to remove the solvent. Porous low-dielectric constant materials are advantageous in that they have a dielectric constant of 3.0 or less. Examples of such porous low-dielectric constant materials include porous SiLK™ and porous silicon carbonated oxide, as examples. A porogen may be included in the porous low-dielectric constant materials to cause the formation of the pores.

Many of the low k materials, however, have properties that are incompatible with other materials employed to fabricate semiconductor devices or are incompatible with processes employed to fabricate the semiconductor devices. For example, adhesion to layers formed from a low dielectric constant material by adjacent layers is often poor, resulting in delamination. Additionally, layers formed from low dielectric materials are often structurally compromised by Chemical Mechanical Polishing (CMP) processes through erosion, as well as adsorption of CMP slurry chemicals. Etching processes often produce micro-trenches and rough surfaces in layers formed from materials having low dielectric constants, which is often unsuitable for subsequent photolithography processes. As a result, these materials are problematic to integrate into damascene fabrication processes. To overcome some of these problems a cap or capping layer typically formed from a material such as $SiO_2$ is employed to protect the low dielectric materials during the CMP processes. The cap layer also serves as a hardmask when the vias and trenches are etched. Unfortunately, the dielectric constant of the capping layer is generally greater than the dielectric constant of the low k material, thereby increasing the overall capacitance of the semiconductor device.

Accordingly, it would be desirable to provide a damascene interconnect structure that includes a porous low k material to reduce the structure's overall dielectric constant but which has a relatively thin capping layer so that the capacitance of the structure is not unduly increased.

SUMMARY OF THE INVENTION

In accordance with the present invention, a method is provided of fabricating a damascene interconnection. The method begins by forming on a substrate a first dielectric layer, a capping layer on the first dielectric sublayer and a resist pattern over the capping layer to define a first interconnect opening. The capping layer and the dielectric layer are etched through the resist pattern to form the first interconnect opening. The resist pattern is removed and a barrier layer is applied over the capping layer and in the first interconnect opening. An interconnection is formed by filling the first interconnect opening with conductive material. The interconnection is planarized to remove excess material and a portion of the first dielectric layer damaged by the planarizing step is selectively etched. A second dielectric layer is applied to replace the damaged portion of the first dielectric.

In accordance with one aspect of the invention, the first dielectric layer is formed from a porous dielectric material.

In accordance with another aspect of the invention, the first interconnect opening comprises a via.

In accordance with another aspect of the invention, the first interconnect opening comprises a via and a trench connected thereto.

In accordance with another aspect of the invention, the planarizing step is performed by CMP.

In accordance with another aspect of the invention, the step of etching the damaged portion of the first dielectric layer is performed by wet etching.

In accordance with another aspect of the invention, the wet etching employs HF as an etchant.

In accordance with another aspect of the invention, the step of etching the damaged portion of the first dielectric layer is performed by reactive ion etching.

In accordance with another aspect of the invention, the reactive ion etching employs an etch gas selected from the group consisting of $C_xF_y$ and $C_xH_yF_z$.

In accordance with another aspect of the invention, a second capping layer is applied over the second dielectric layer.

In accordance with another aspect of the invention, a diffusion barrier is applied after planarizing the interconnection to remove excess material.

In accordance with another aspect of the invention, the diffusion barrier is a metal diffusion barrier.

In accordance with another aspect of the invention, the metal diffusion barrier comprises CoWP.

In accordance with another aspect of the invention, excess portions of the metal diffusion barrier are selectively etched along with the damaged portion of the first dielectric layer.

In accordance with another aspect of the invention, the damascene interconnection is a dual damascene interconnection and further comprising the steps of applying a second resist pattern over the capping layer and etching the dielectric layer to form a second interconnect opening that is connected to said first interconnect opening and in which interconnections will be formed.

In accordance with another aspect of the invention, a lower interconnection is formed on the substrate and an etch stop layer is formed on the lower interconnection.

In accordance with another aspect of the invention, the first dielectric layer is a porous low k dielectric layer.

In accordance with another aspect of the invention, the porous low k dielectric layer has a dielectric constant less than about 2.7.

In accordance with another aspect of the invention, an integrated circuit is provided having a damascene interconnection constructed in accordance any of the aforementioned methods.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Herein, an opening exposing a lower interconnection is referred to as a via, and a region where interconnections will be formed is referred to as a trench. Hereinafter, the present invention will be described by way of an example of a via-first dual damascene process. Via-first refers to the order in which the trench and via features are etched. For via-first, the via feature is etched through the entire thickness of the ILD before the trench feature is etched through a portion of the ILD thickness. Conversely, for trench-first, the trench feature is etched partially through the thickness of the ILD before the via feature is etched through the remaining ILD thickness at the base of the trench feature. While a via-first process will be illustrated, the present invention is also applicable to trench-first and other dual damascene processes as well as single damascene processes.

A method of fabricating dual damascene interconnections according to an embodiment of the present invention will now be described with reference to FIGS. 1 through 11. Of course, the present invention is equally applicable to a single damascene interconnect structure.

Figure 1:
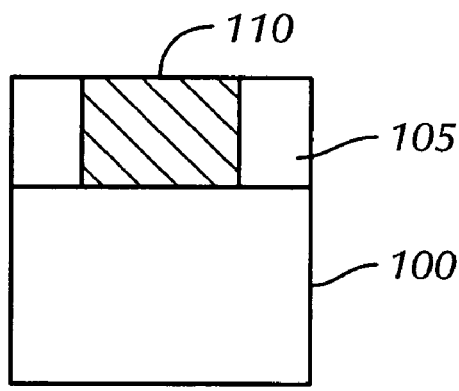
FIGS. 1-11 show cross-sectional views illustrating the formation of a dual damascene structure constructed in accordance with one embodiment of the present invention.

As shown in FIG. 1, a substrate 100 is prepared. A lower ILD layer 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistance. Also, the surface of the lower interconnection 110 is preferably planarized.

Figure 2:
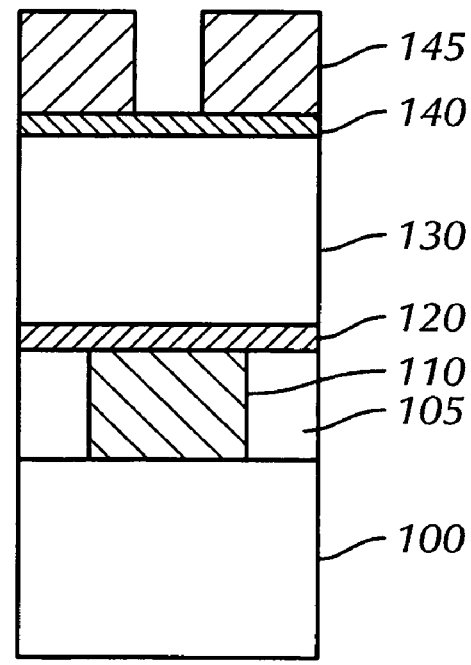

Referring to FIG. 2, a barrier or etch stop layer 120, a low-k ILD layer 130, and a capping layer 140 are sequentially stacked on the surface of the substrate 100 where the lower interconnection 110 is formed, and a photoresist pattern 145 is formed on the capping layer 140 to define a via.

The barrier or etch stop layer 120 is formed to prevent electrical properties of the lower interconnection 110 from being damaged during a subsequent etch process for forming a via. Accordingly, the etch stop layer 120 is formed of a material having a high etch selectivity with respect to the ILD layer 130 formed thereon. In one embodiment, the etch stop layer 120 is formed of SiC, SiN, or SiCN, having a dielectric constant of 4 to 5. The etch stop layer 120 is as thin as possible in consideration of the dielectric constant of the entire ILD layer, but thick enough to properly function as an etch stop layer.

The ILD layer 130 is formed of a low k material such as a porous dielectric material. Typically, the porous dielectric material comprises a porous low-k material having a dielectric constant (k) value of 3.0 or lower. For example, the porous dielectric material may comprise a material having a k value of about 3.0 or less with a porogen introduced in order form pores, which lowers the dielectric constant to 2.7 or less, and more preferably about 2.5 or less, e.g. 1.8 or 1.9. Typically, the more pores formed in the material, the lower the dielectric constant k of the dielectric material will be. The ILD layer 130 may have a thickness of about 350 nm, for example. Alternatively, the porous dielectric material may comprise other thicknesses. The porous dielectric material may be selected from a wide range of materials, including, without limitation, comprise porous methylsilsesquioxane (MSQ), porous inorganic materials, porous CVD materials, porous organic materials, or combinations thereof.

One widely used approach that can be employed to form porous low k materials relies on the incorporation of a thermally degradable material (porogen) within a host thermosetting matrix. Upon heating, the matrix material crosslinks, and the porogen undergoes phase separation from the matrix to form nanoscopic domains. Subsequent heating leads to porogen decomposition and diffusion of the volatile by-products out of the matrix. Under optimized processing conditions, a porous network results in which the pore size directly correlates with the original phase-separated morphology. Two commercially available materials of this type are Dow Chemical's porous SILK and IBM's DendriGlass materials.

Dendriglass is a chemical composition containing MSQ and various amounts of a second phase polymeric material, i.e. a pore-forming agent. Dendriglass can be made into a porous film with a dielectric constant in a range between about 1.3 and about 2.6 depending on the amount of the second phase material added to the film. The second phase polymeric material, or the pore-forming agent, is a material that is usually a long chained polymer which can be decomposed and volatilized and driven from the matrix material, i.e. MSQ, after the film has been cured in a first curing process. Dendriglass can be spin-coated and then cured temperature at a temperature of less than about 350° C. Finally, the completely etched structure is heated to a temperature higher than the first temperature, or preferably higher than about 400° C. to 450° C., for a time period long enough to drive out the second phase polymeric material from the Dendriglass resulting in a porous low-k dielectric film.

Referring again to FIG. 2, after formation of the ILD layer 130, capping layer 140 is formed thereabove. The capping layer 140 prevents the ILD layer 130 from being damaged when damascene interconnections are planarized using chemical mechanical polishing (CMP). The capping layer 140 also serves as a hardmask during the subsequent etching steps used to form vias and trenches. The capping layer 140 may be formed of any appropriate material such as $SiO_2$, SiOF, SION, SiCOH, SiC, SiN, or SICN. For example, in conventional processes an organosilicon compound such as tetraethoxysilane (TEOS) is used to form an $SiO_2$ capping layer by PECVD. As previously mentioned, the capping layer 140 must generally be sufficient thick to prevent damage to the underlying ILD layer 130 during subsequent CMP processing. By way of example, typical thicknesses of the capping layer 140 is about 50 nm-150 nm.

Unfortunately, the dielectric constant of the capping layer 140 is generally greater than the dielectric constant of the ILD layer 130, thereby increasing the overall capacitance of the structure.

Figure 3:
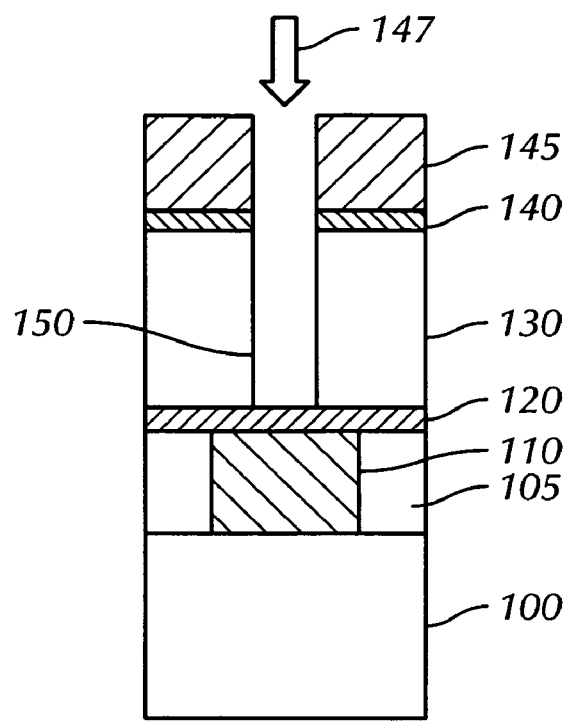

After formation of ILD layer 130 and capping layer 140, the process continues by forming the via photoresist pattern 145 by depositing a layer of a photoresist and then performing exposure and developing processes using a photo mask defining a via. Referring to FIG. 3, the ILD layer 130 is anisotropically etched (147) using the photoresist pattern 145 as an etch mask to form a via 150. The ILD layer 130 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD layer 130 is selectively etched and the etch stop layer 120 is not etched.

Figure 4:
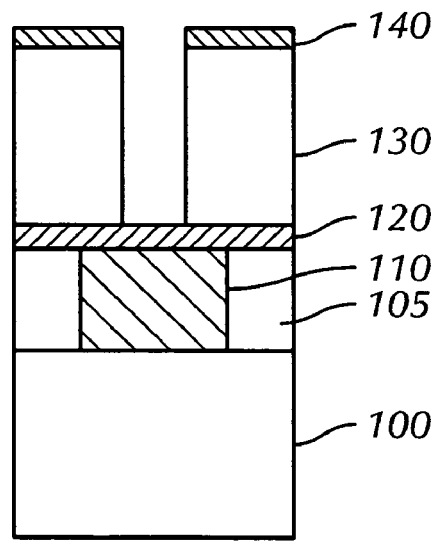

Referring to FIG. 4, the via photoresist pattern 145 is removed using a stripper. If the photoresist pattern 145 is removed using $O_2$-ashing, which is widely used for removing a photoresist pattern, the ILD layer 130, which often contains carbon, may be damaged by the $O_2$-based plasma. Thus, the photoresist pattern 145 alternatively may be removed using $H_2$-based or NH3-based plasma.

Figure 5:
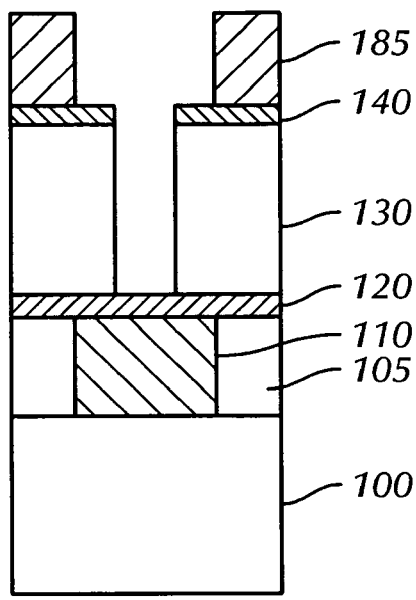
Figure 6:
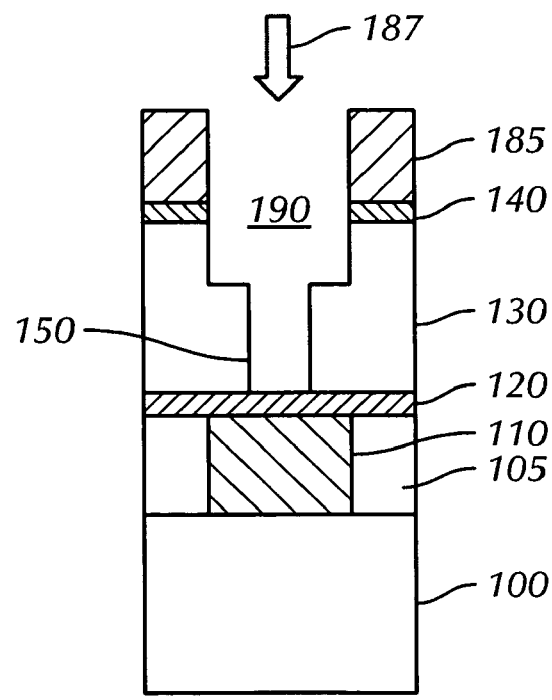
Figure 7:
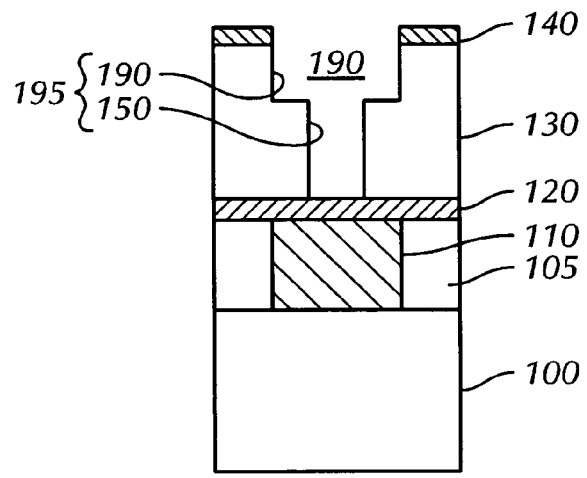

Referring to FIG. 5, a trench photoresist pattern 185 is formed, followed by formation of a trench 190 in FIG. 6. The capping layer 140 is etched using the photoresist pattern 185 as an etch mask, and then the ILD layer 130 is etched to a predetermined depth to form the trench 190. The resulting structure, shown in FIG. 7, defines a dual damascene interconnection region 195, which includes the via 150 and the trench 190.

Figure 8:
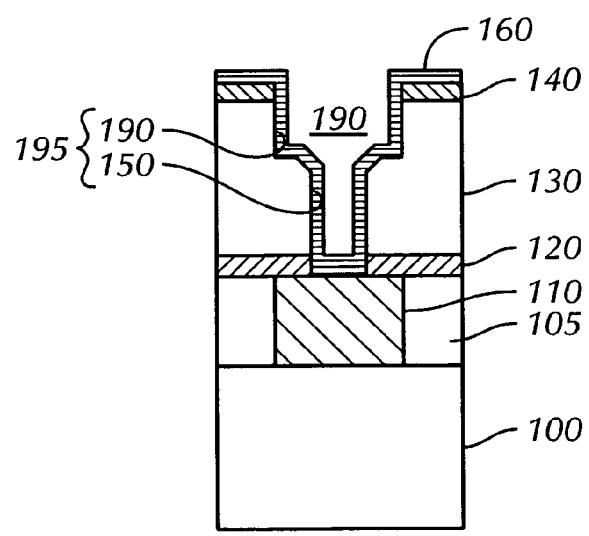

Referring to FIG. 8, the etch stop layer 120 exposed in the via 150 is etched until the lower interconnection 110 is exposed, thereby completing the dual damascene interconnection region 195. The etch stop layer 120 is etched so that the lower interconnection 110 is not affected and only the etch stop layer 120 is selectively removed.

Figure 9:
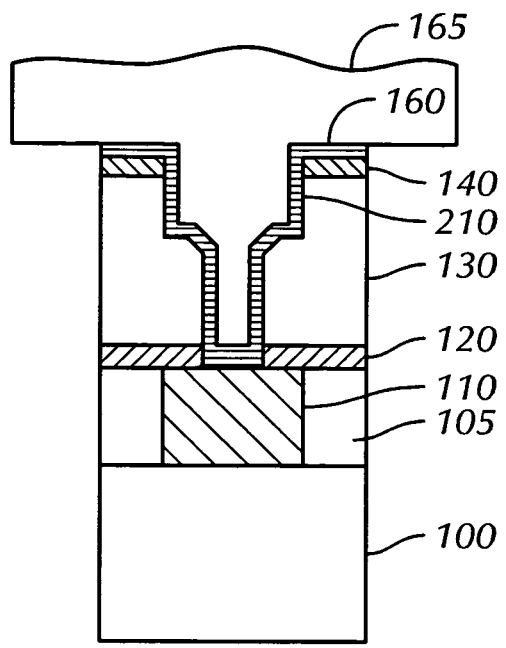
Figure 10:
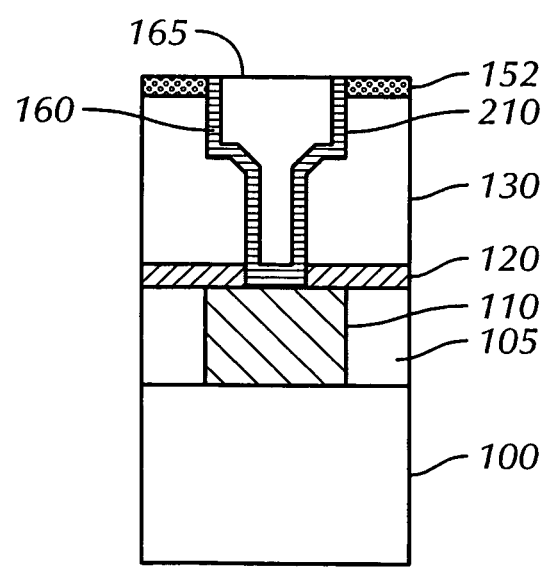

A barrier layer 160 is formed on the dual damascene interconnection region 195 and capping layer 140 to prevent the subsequently formed conductive layer from diffusing into ILD layer 130. The barrier layer 160 is generally formed from a conventional material such as tantalum, tantalum nitride, titanium, titanium silicide or zirconium. After formation of the barrier layer 160 the copper conductive layer is formed on the barrier layer by an electroplating process. Referring to FIG. 9, the bulk copper layer 165 is formed on the dual damascene interconnection region 195. In FIG. 10, the excess metal, capping material and barrier material above the interconnects is then removed by chemical mechanical polishing (CMP), thereby forming a dual damascene interconnection 210. The CMP process involves introducing a chemical slurry to the surface of the ILD while using a rotating polishing pad to remove excess metal and planarize the surface of the ILD.

In a CMP process, the structure is positioned on a CMP pad located on a platen or web. A force is then applied to press the structure against the CMN pad. The CMP pad and the structure are moved against and relative to one another while applying the force to polish and planarize the surface. A polishing solution, often referred to as polishing slurry, is dispensed on the CMP pad to facilitate the polishing. The polishing slurry typically contains an abrasive and is chemically reactive to selectively remove the unwanted material, for example, the metal and barrier layers, more rapidly than other materials, for example, a dielectric material.

As previously noted, the capping layer 140 is provided to prevent damage to the ILD layer 130 during the CMP process. The capping layer 140 also serves as an etch stop layer. However, the dielectric constant of the capping layer 140 is generally greater than the dielectric constant of the ILD layer 130. Therefore, the thickness of the capping layer should be minimized. Ideally, as indicated in FIG. 10, the capping layer 140 needs to be removed to obtain lower capacitances for high performance devices. In this case, the surface of the ILD 130 is also polished and damaged by direct application of CMP to the ILD 130. The damaged ILD material needs to be removed since its dielectric constant is much greater than that of the intact ILD material and because the damaged layer often leads to moisture retention. Such damage may cause, for example, fluorine addition and carbon depletion from the low-k material adjacent to the etched surface. In addition to a higher effective k, the resultant structures are susceptible to void formation, outgassing and blister formation. The voids in turn may cause an increase in leakage current at elevated voltages and reduction in breakdown voltage.

Since a certain degree of damage is likely to arise to a portion of the underlying ILD layer, the present invention etches the damaged portion of the ILD layer. As shown in FIG. 10, the portion of ILD layer 130 that is damaged by the CMP process is represented by damaged layer 152. By way of example, the thickness of the damaged layer 152 is generally between about 5 nm-80 nm. The etching may be performed by any appropriate technique that selectively etches the damaged ILD layer 152 but not the intact, undamaged ILD layer underlying the damaged portion of the ILD layer. The etching process that is employed, may be, for example, a wet etching process using, for instance, fluoride-based aqueous chemistries. An example of a fluoride-based aqueous chemistry is HF. Alternatively, RIE may be employed using $C_xF_y$ or $C_xH_yF_z$ as the etch gas with Ar, $O_2$ and/or N₂ gases. After RIE, a wet treatment using an organic solvent may be needed to remove remaining polymer material.

Figure 11:
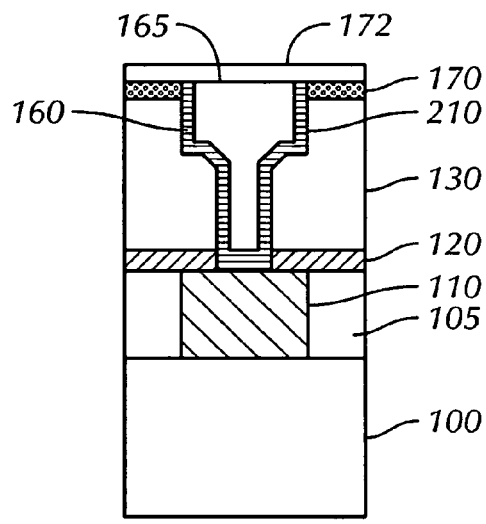

After the damaged ILD layer 152 is etched a dielectric film is deposited over the resulting structure to replace the damaged ILD material. As shown in FIG. 11, the dielectric film 170 is planarized to expose the surface of the copper interconnect 165. Exemplary materials that may be employed for the dielectric film include SiCOH, $Si_3N_4$, $SiO_2$ and SiC(N,H). Next, an upper capping layer 172 is deposited over the dielectric layer 170 and the exposed portion of the copper interconnect 165. The capping layer 172 serves as both an etch stop and a barrier to the diffusion of copper. The capping layer 172 may also prevent damage to the underlying dielectric film if a plasma treatment is required to reduce the oxidized copper surface, which may have oxidized prior to deposition of the capping layer 172. Advantageously, the capping layer 172 may be significantly thinner than would otherwise need to be provided if it were applied before CMP were performed.

In some embodiments of the invention, after the CMP processing shown in FIG. 10 but before the damaged layer ILD 152 is etched, a metal cap may be selectively plated over the copper layer 165. The metal cap may be formed from a metal such as CoWP. The metal cap prevents diffusion of copper, thereby allowing a thinner capping layer 172 to be used. The CoWP cap may be formed, for example, by an electroless deposition process.

Figure 12:
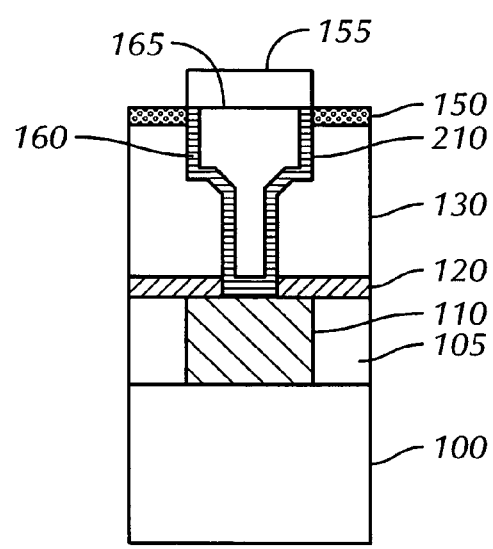
FIGS. 12-13 show alternative process steps that may be employed during the formation of the dual damascene structure depicted in FIGS. 1-11.
Figure 13:
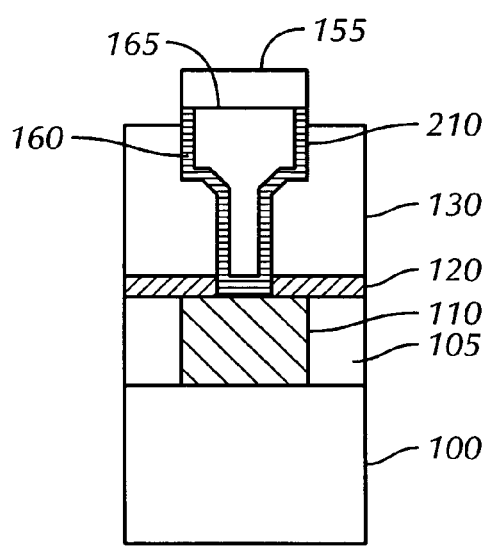

FIG. 12 shows the CoWP metal cap 155 formed over the copper layer 165. Unfortunately, as also shown, residual CoWP may remain on exposed portions of the damaged ILD surface 152 located between the interconnections 210. However, as seen in FIG. 13, such residual material can be advantageously removed at the same time as the damaged layer during the process of etching the damaged ILD 152, as described above in accordance with the present invention. The process then continues with the deposition of dielectric film 170 as discussed above.

Although various embodiments are specifically illustrated and described herein, it will be appreciated that modifications and variations of the present invention are covered by the above teachings and are within the purview of the appended claims without departing from the spirit and intended scope of the invention. For example, those of ordinary skill in the art will recognize that the via-first dual damascene process described with reference to FIGS. 1 through 13 can be applied to a trench-first dual damascene process.

The invention claimed is:

1. A method of fabricating a damascene interconnection, the method comprising:
    (a) forming on a substrate a first dielectric layer;
    (b) forming a capping layer on the first dielectric sublayer;
    (c) forming a resist pattern over the capping layer to define a first interconnect opening;
    (d) etching the capping layer and the dielectric layer through the resist pattern to form the first interconnect opening;
    (e) removing the resist pattern;
    (f) applying a barrier layer over the capping layer and in the first interconnect opening;
    (g) forming an interconnection by filling the first interconnect opening with conductive material;
    (h) planarizing the interconnection to remove excess material;
    (i) selectively etching a portion of the first dielectric layer damaged by the planarizing step (h); and
    (j) applying a second dielectric layer to replace the damaged portion of the first dielectric.

2. The method of claim 1 wherein the first dielectric layer is formed from a porous dielectric material.

3. The method of claim 1 wherein the first interconnect opening comprises a via.

4. The method of claim 1 wherein the first interconnect opening comprises a via and a trench connected thereto.

5. The method of claim 1 wherein the planarizing step is performed by CMP.

6. The method of claim 1 wherein the step of etching the damaged portion of the first dielectric layer is performed by wet etching.

7. The method of claim 6 wherein the wet etching employs HF as an etchant.

8. The method of claim 1 wherein the step of etching the damaged portion of the first dielectric layer is performed by reactive ion etching.

9. The method of claim 8 wherein the reactive ion etching employs an etch gas selected from the group consisting of $C_xF_y$ and $C_xH_yF_z$.

10. The method of claim 1 further comprising applying a second capping layer over the second dielectric layer.

11. The method of claim 1 further comprising applying a diffusion barrier after planarizing the interconnection to remove excess material.

12. The method of claim 1 wherein the diffusion barrier is a metal diffusion barrier.

13. The method of claim 12 wherein the metal diffusion barrier comprises CoWP.

14. The method of claim 12 wherein step (i) includes the step of selectively etching excess portions of the metal diffusion barrier along with the damaged portion of the first dielectric layer.

15. The method of claim 1 wherein the damascene interconnection is a dual damascene interconnection and further comprising the steps of applying a second resist pattern over the capping layer and etching the dielectric layer to form a second interconnect opening that is connected to said first interconnect opening and in which interconnections will be formed.

16. The method of claim 1 further comprising, before step (a): forming a lower interconnection on the substrate; and forming an etch stop layer on the lower interconnection.

17. The method of claim 1 wherein the first dielectric layer is a porous low k dielectric layer.

18. The method of claim 17 wherein the porous low k dielectric layer has a dielectric constant less than about 2.7.

19. An integrated circuit having a damascene interconnection constructed in accordance with the method of claim 1.

* * * * *

UNITED STATES PATENT AND TRADEMARK OFFICE
CERTIFICATE OF CORRECTION

PATENT NO. : 7,300,868 B2
APPLICATION NO. : 11/394011
DATED : November 27, 2007
INVENTOR(S) : Masanaga Fukasawa et al.

It is certified that error appears in the above-identified patent and that said Letters Patent is hereby corrected as shown below:

Specification, Col. 1, Line 37, after "that", change "have" to -- has --.

Specification, Col. 1, Line 38, after "explored", change "are" to -- is --.

Specification, Col. 2, Line 23, after "dialectric", change "sublayer" to -- layer --.

Specification, Col. 2, Line 35, after "dialectric", insert -- layer --.

Specification, Col. 3, Line 21, after "accordance", insert -- with --.

Specification, Col. 4, Line 40, after "order", insert -- to --.

Specification, Col. 4, Line 63, after "porous", change "SILK" to -- SiLK --.

Specification, Col. 5, Line 9, first word in line, delete "temperature".

Specification, Col. 5, Line 24, after "SiOF", change "SION" to -- SiON --.

Specification, Col. 5, Line 24, before "For", change "SICN" to -- SiCN --.

Specification, Col. 5, Line 24, after "be", change "sufficient thick" to -- of sufficient thickness --.

Specification, Col. 6, Line 23, before "pad", (first occurrence) change "CMN" to -- CMP --.

Specification, Col. 7, Line 4, after "etched", insert -- , --.

UNITED STATES PATENT AND TRADEMARK OFFICE
CERTIFICATE OF CORRECTION

PATENT NO.       : 7,300,868 B2
APPLICATION NO.  : 11/394011
DATED            : November 27, 2007
INVENTOR(S)      : Masanaga Fukasawa et al.

It is certified that error appears in the above-identified patent and that said Letters Patent is hereby corrected as shown below:

Claim 1, Col. 7, Line 53, after "dielectric", change "sublayer" to -- layer --.

Claim 1, Col. 8, Line 8, after last word "dielectric", insert -- layer --.

Signed and Sealed this

Twenty-ninth Day of April, 2008

JON W. DUDAS
*Director of the United States Patent and Trademark Office*